(12) United States Patent
Upchurch

(10) Patent No.: US 8,137,765 B2
(45) Date of Patent: Mar. 20, 2012

(54) METHOD OF PRODUCING ALLOYED IRON ARTICLE

(76) Inventor: Charles J. Upchurch, DeQuincy, LA (US)

( * ) Notice: Subject to any disclaimer, the term of this patent is extended or adjusted under 35 U.S.C. 154(b) by 377 days.

(21) Appl. No.: 12/387,733

(22) Filed: May 7, 2009

(65) Prior Publication Data

US 2009/0214888 A1 Aug. 27, 2009

Related U.S. Application Data

(63) Continuation-in-part of application No. 11/172,042, filed on Jun. 30, 2005, now abandoned, which is a continuation-in-part of application No. 10/642,874, filed on Aug. 18, 2003, now Pat. No. 6,913,841.

(51) Int. Cl.
*C23C 16/44* (2006.01)
(52) U.S. Cl. ............ 427/591; 427/421.1; 427/250; 427/557; 427/540; 164/46; 164/47
(58) Field of Classification Search ........... 427/421.1, 427/250, 540, 557, 591; 164/46, 47
See application file for complete search history.

(56) References Cited

U.S. PATENT DOCUMENTS

| | | | |
|---|---|---|---|
| 1,165,338 A | 12/1915 | Moench | |
| 2,759,250 A | 8/1956 | Schaefer | |
| 3,065,107 A | 11/1962 | Hanink | |
| 3,165,823 A | 1/1965 | Rowdy | |
| 3,305,384 A | 2/1967 | Kenderi | |
| 3,400,010 A | 9/1968 | Keating | |
| 3,415,672 A | 12/1968 | Levinstein | |
| 3,670,400 A * | 6/1972 | Singer | 29/527.5 |
| 3,794,511 A | 2/1974 | Baranow | |
| 3,864,093 A | 2/1975 | Wolfla | |
| 3,909,921 A | 10/1975 | Brooks | |
| 3,954,512 A | 5/1976 | Kanter | |
| 3,959,030 A | 5/1976 | Satake | |
| 4,036,670 A * | 7/1977 | De Walt | 148/625 |
| 4,070,210 A | 1/1978 | Gierek | |
| 4,202,709 A | 5/1980 | Shibamori | |
| 4,331,854 A * | 5/1982 | Balordi | 219/630 |
| 4,454,823 A | 6/1984 | Stoller | |
| 4,546,051 A | 10/1985 | Uchida | |
| 4,619,845 A | 10/1986 | Ayers | |
| 4,655,852 A | 4/1987 | Rallis | |
| 4,657,787 A | 4/1987 | Singer | |
| 4,684,447 A | 8/1987 | Murali | |
| 4,983,427 A | 1/1991 | Sansome | |
| 4,987,003 A | 1/1991 | Schuster | |
| 5,236,788 A | 8/1993 | Manier | |
| 5,411,771 A | 5/1995 | Tsai | |

(Continued)

OTHER PUBLICATIONS

KINETIKS 4000 Cold Spray System 4 pages, company brochure.

(Continued)

*Primary Examiner* — James Lin
*Assistant Examiner* — Nathan T Leong
(74) *Attorney, Agent, or Firm* — G. Turner Moller

(57) ABSTRACT

Liquid aluminum is sprayed as a fine mist onto an alloyed iron article to produce a thin tenacious non-corrodible layer. In some embodiments, air is heated and delivered through insulated tubing to a container having solid aluminum therein. In some embodiments the air is heated by an electric induction coil. In some embodiments, the container is heated independently of the heated air. In some embodiments, the container is heated by an electric induction coil.

11 Claims, 3 Drawing Sheets

U.S. PATENT DOCUMENTS

| | | |
|---|---|---|
| 5,960,835 A | 10/1999 | Izaki |
| 6,162,509 A | 12/2000 | Cherico |
| 6,727,005 B2 | 4/2004 | Gimondo |
| 6,913,841 B2 | 7/2005 | Upchurch |
| 6,929,825 B2 | 8/2005 | Wustman |

OTHER PUBLICATIONS

KINETIKS 3000—1 page from www.cgt-gmbh.com.
KINETIKS 4000—3 pages from www.cgt-gmbh.com.

\* cited by examiner

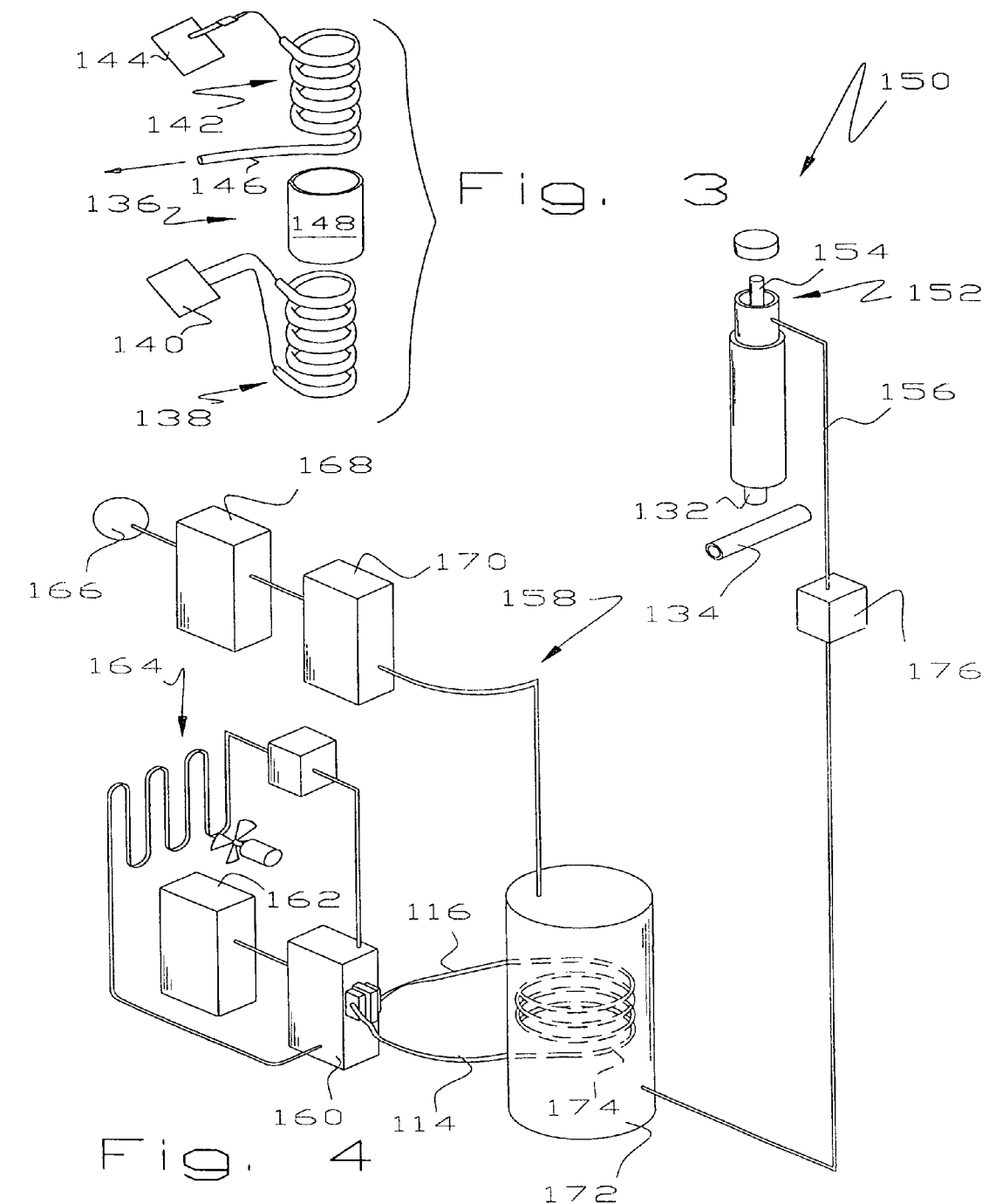

METHOD OF PRODUCING ALLOYED IRON ARTICLE

This application is a continuation-in-part of application Ser. No. 11/172,042, filed Jun. 30, 2005 now abandoned which is, in turn, a continuation-in-part of application Ser. No. 10/642,874, filed Aug. 18, 2003, now U.S. Pat. No. 6,913,841.

This invention relates generally to a method and apparatus for producing non-corrodible alloyed iron articles and to the resulting articles.

BACKGROUND OF THE INVENTION

It is well known that alloyed iron articles, which is used herein to include articles made of steel or other iron alloys, corrode easily by the reaction of iron with oxygen to produce ferrous oxide. The exception, of course, are a group of nickel rich iron alloys sometimes referred to as stainless steels. There has accordingly developed a large industry aimed at prevention or control of iron deterioration due to oxidation.

In a broad sense, the industry is currently limited to providing coatings which prevent oxygen from reaching the alloyed iron article although there other proposals have been made in the literature or have been attempted in the past. For example, at one time, an iron alloy was manufactured which produced an adherent iron oxide layer which did not spall off, or if it did, it produced a healing adherent layer in much the same manner that aluminum oxide produces an adherent layer on aluminum thereby making aluminum relatively non-corrodible. It will suffice to say there is considerable room for improvement in making alloyed iron articles less corrodible.

There are many proposals to produce aluminum layers on alloyed iron articles such as found in U.S. Pat. Nos. 1,165,338; 2,759,250; 3,165,823; 3,400,010; 3,415,672; 3,794,511; 3,864,093; 3,909,921; 3,954,512; 3,959,030; 4,036,670; 4,070,210; 4,202,709; 4,454,823; 4,546,051; 4,619,845; 4,655,852 4,657,787; 4,684,447; 4,983,427; 4,987,003; 5,236,788; 5,411,771; 5,960,835; 6,162,509; 6,727,005; 6,913,841; 6,919,543 and 6,929,825.

SUMMARY OF THE INVENTION

One of the advantages of this invention is the spraying of aluminum on iron alloys in such a way to produce a tough adherent aluminum layer substantially free of aluminum oxide where the aluminum layer substantially prevents rust or corrosion of the underlying iron alloy. In some embodiments, air is heated in a suitable manner and delivered through insulated tubing to a container having solid aluminum therein where the heated air melts some of the aluminum and the heated air and aluminum is delivered through a nozzle in a fine mist onto the alloyed iron article. In some embodiments, the air is heated with an electric induction coil. In some embodiments, a container is heated with an electric induction coil to partly melt aluminum in the container which is delivered through a nozzle by a compressed gas, usually air. In some embodiments, air is heated and the aluminum container is also heated.

In some embodiments, the liquid aluminum mist is so fine that it is not visible to the naked eye during daylight although the effect can be readily seen on the alloyed iron article on which it is sprayed because a light silver color appears on the article. Spraying is typically done at ambient or near ambient temperatures.

In some embodiments, the resultant article typically has beneficial non-corroding properties and the aluminum layer tenaciously adheres to the alloyed iron article. The aluminum layer is considerably smoother than previously and the steel article being coated is surprisingly cool.

It is an object of this invention to provide an improved technique for applying a tenacious aluminum layer onto an alloyed iron article.

It is yet another object of this invention to provide an improved method and apparatus that may be used effectively and efficiently in ambient temperatures and atmospheric conditions.

It is an object of this invention to provide an improved method and apparatus for minimizing or preventing alloyed iron articles from rusting.

It is still another object of this invention to provide an alloyed iron article that has an aluminum coating which effectively prevents or minimizes corrosion.

These and other objects and advantages of this invention will become more apparent as this description proceeds, reference being made to the accompanying drawings and appended claims.

BRIEF DESCRIPTION OF THE DRAWINGS

FIG. 3 is an exploded isometric view of an air heating element; and

FIG. 4 is a partly schematic, partly pictorial view of another embodiment of an apparatus for spraying a coating layer onto a substrate.

DETAILED DESCRIPTION

Figure 1:
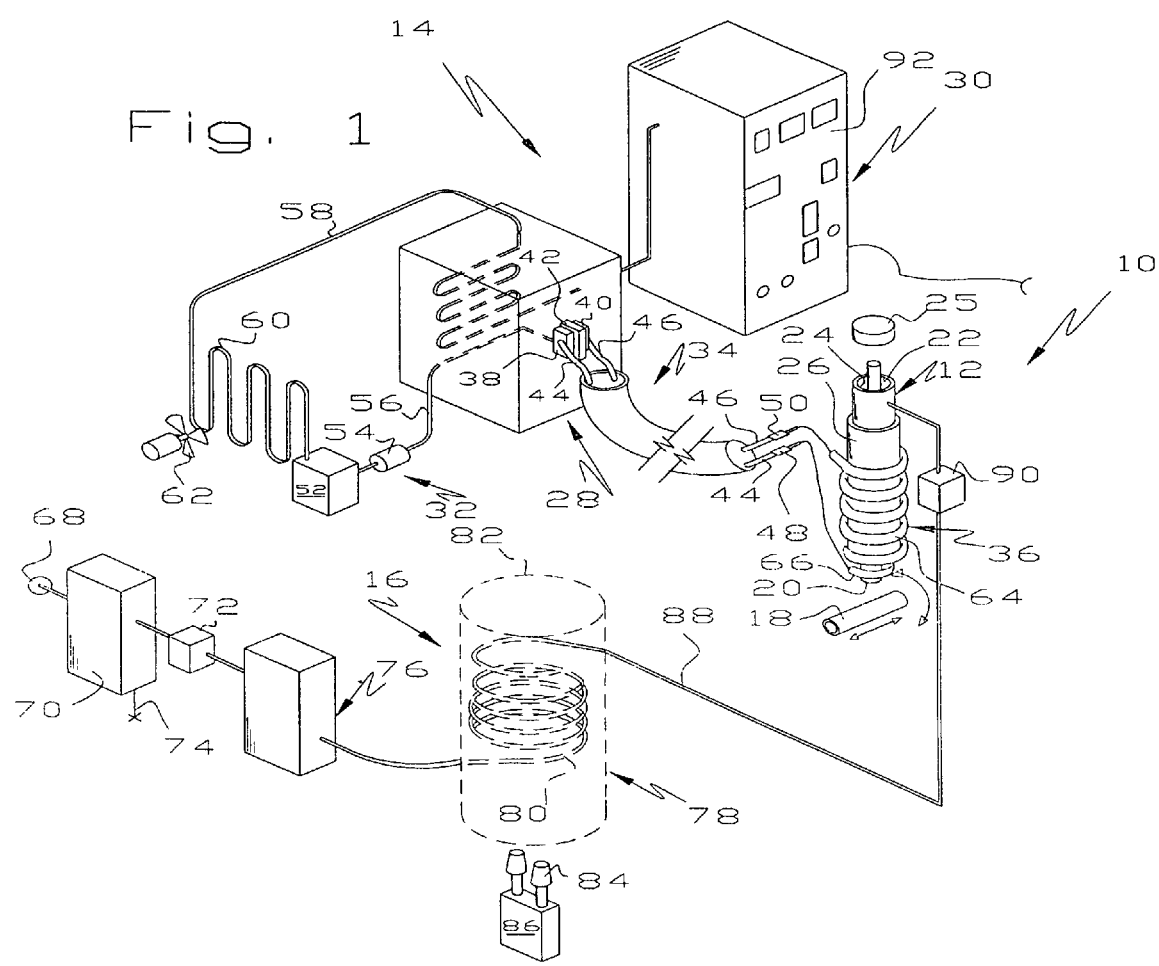
FIG. 1 is a partly schematic, partly pictorial view of one embodiment of an apparatus for spraying a coating layer onto a substrate.

This invention is an improvement over that disclosed in U.S. Pat. No. 6,943,841 and copending application Ser. No. 11/172,042, the disclosures of which are incorporated herein by reference.

As noted, the present invention relates to methods and apparatus for use in coating alloyed iron or steel articles with an aluminum coating, as well as to the resulting coated articles. As detailed below, apparatus and methods are described in which aluminum is heated, such as by hot air, and a compressed gas, such as air, can be used to generate a spray of heated aluminum, which can then be sprayed onto the alloyed iron article to be coated. Different apparatus and methods may be used to perform the technique of providing the alloyed iron article with the desired coating, and various changes and adaptations may be employed without departing from the spirit and scope of the invention, which is to be measured solely by the claims themselves.

I have found that the type of gas used affects some aspects of the aluminum layer. Compressed air and/or argon produce more tenacious aluminum layers but using carbon dioxide, helium, nitrogen and mixtures of carbon dioxide and argon produce smoother and better appearing aluminum layers but which are not so tenacious in the sense that the resultant article cannot be bent without tending to crack or degrade the aluminum layer. Thus, the type gas used in the conduct of the methods of this invention may depend on cost considerations and the intended use of the treated article. For articles which will be worked, bent or welded where the main goal is the production of a non-corrodible alloyed iron article, compressed air is likely much preferred because of the tenacious aluminum layers it produces and low cost. The preference for compressed air is counter intuitive because prior art aluminum coatings have been undesirably fragile which is at least partly due to the creation of aluminum oxide particles in the coating.

One purpose of the compressed gas stream is to deliver the aluminum mist at relatively high velocity against the alloyed iron article. The simplest technique to achieve high velocity is to control the pressure of the gas supply and the pressure losses through the gas supply system. Considerable testing has been done using compressed air at 100-120 psig with satisfactory results. Further testing suggests that higher pressures provide better aluminum layers although there is an apparent limit to the effect of higher pressure because the propulsive gas will move no faster than sonic velocity through a nozzle opening. When pressures decline to less than about 25-40 psig, degradation of the aluminum layer increases and pressures less than about 25 psig are impractical because of poor quality of the aluminum layers. Compressed air is clearly desirable due to low cost and availability.

The velocity of the aluminum mist exiting from a nozzle is a function of the difference in pressure between the container and the atmosphere. Calculations show the velocity of the aluminum mist exiting from the nozzle, in accordance with the methods and apparatus described below, with 100 psig compressed air, is above 300 feet per second and, with 25 psig compressed air, is above 75 feet per second. Experience has shown that using compressed air below 25 psig has not produced acceptable aluminum layers. Thus, an important feature of the methods and apparatus described herein is to spray liquid aluminum onto alloyed iron articles with spray velocities above 75 feet per second and preferably above 300 feet per second in order to achieve the desired coating. The force of the liquid aluminum colliding with the alloyed iron article, along with the heat involved, contribute to the production of a tenacious aluminum layer on the alloyed iron article.

The workability or tenaciousness of the resultant aluminum layer can be demonstrated in a number of ways. Steel straps 1 inch wide and 0.1 inch thick, layered with a series of aluminum layers sprayed one after another to produce a relatively thick aluminum layer, can be bent 180° on a mandrel of three fourths inch radius without cracking the aluminum layer on either the inside or outside radius. A wire buffing wheel applied to the aluminum surface of such a strap simply shines the surface and does not remove it. Cutting a layered alloyed iron article with a saw leaves a kerf in which the aluminum layer does not appear to separate in any manner from the underlying alloyed iron article. Sprayed articles can be struck with the ball of a ball peen hammer which dents the aluminum coating and the underlying iron substrate with no apparent effect on the coating, i.e. there is no observed cracking and no pitting of the aluminum.

Perhaps most surprising, welds can be applied by conventional electric arc welding techniques without causing the aluminum layer to burn off or otherwise retreat from the edge of the weld. This suggests the aluminum layer is far more tenaciously bonded to the underlying alloyed iron article than might otherwise be thought. In some fashion, the aluminum has apparently become a part of the steel. Equally odd, welding rods and techniques used to weld steel produce adherent welds on the article. It will be realized that aluminum is welded with heliarc techniques because normal welding rods used for steel do not produce adherent welds.

Much theorizing can be done to explain why the aluminum layer is so tenacious. It is possible that some type of atomic or molecular bond occurs between the aluminum and the alloyed iron article or it may be possible that some type aluminum-iron alloy is formed on the exposed surface. The exact mechanism is currently unknown. It will suffice to say that the aluminum layer appears to be a permanent part of the alloyed iron article because it cannot be removed by normal means less than grinding away the thickness of the layer. One factor believed to contribute to the tenaciousness of the aluminum layer is the relative absence of aluminum oxides in the coating. This is somewhat counter intuitive given that spraying is being done in air using compressed air as the atomizing and propulsive medium. Without being bound by any theory, it appears this is at least partly due to the fact that the aluminum is not heated too high. As a rule of thumb, the rate of most chemical reactions double with every 10° C. rise in temperature. By not heating the aluminum too much above its melting point, the generation of aluminum oxides may be much reduced. It will be evident, of course, that aluminum droplets form on the solid aluminum source and are almost immediately blown off by compressed air onto the substrate. When the substrate is at roughly room temperature, the sprayed aluminum solidifies almost immediately. Thus, the time during which oxides can form is typically very short.

The corrosion resistance of the aluminized alloyed iron article made in accordance with the methods and apparatus described herein can be demonstrated by placing the article in a tank and spraying it with salt water for thirty days. At the end of the thirty day period, no visible rust appears on the aluminized surface.

Articles produced with the techniques disclosed herein are smoother than those produced with the equipment shown in U.S. Pat. No. 6,943,841 and pending application Ser. No. 11/172,042 and, so far as can be determined, are equally non-corrodible and have more tenacious aluminum coatings. In addition, the alloyed iron article being coated is surprisingly cool. In one application, a 5 foot long steel pipe with an outside diameter of six inches was moved under an atomizer and coated along a 3 inch wide path, turned by grasping the pipe ends with bare hands, and then sprayed along an adjacent path, using the methods and apparatus described herein. The ends of the pipe were cool enough that the worker suffered no discomfort in handling the pipe ends with bare hands. In addition, the ends of the pipe had been wrapped, before coating, with duct tape. Even though the duct tape was sprayed with aluminum and was covered with an aluminum layer, the duct tape had not caught fire and, indeed, was not scorched.

Figure 2:
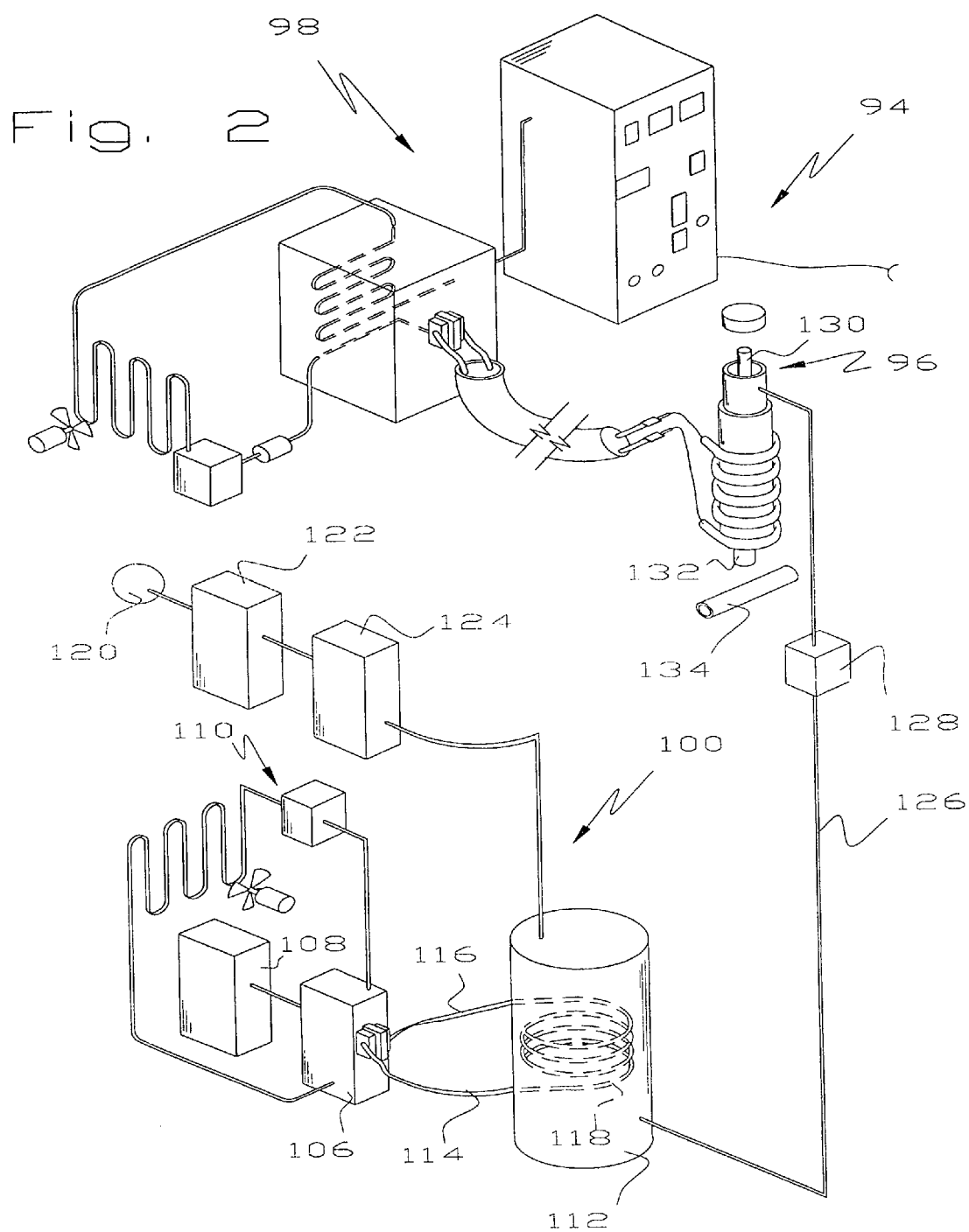
FIG. 2 is a pictorial view of another embodiment of an apparatus for spraying a coating layer onto a substrate.

Referring to FIGS. 1 and 2, a spray system 10 comprises a container or compartment 12 for receiving a quantity of solid aluminum, a heating circuit 14 for heating the container 12, and a high pressure gas delivery system 16.

In some embodiments, the container 12 is supported in a more-or-less fixed position in any suitable manner and an article 18 to be coated is mounted on suitable equipment to be moved back and forth, and rotated as desired or necessary, under a nozzle 20 which is an exit opening of the container 12. Suitable nozzles are commercially available from Wyatt Compressor of Broussard, La. or International Surface Preparations of Houston, Tex. In some embodiments, the container 12 can be of steel and includes an open top 22 for loading an aluminum bar or rod 24 into the container 12. A cap 25 closes the container top 22 and, in some embodiments, is threaded onto the container 12. An insulating blanket 26 may be wrapped around the bottom of the container 12 in order to accommodate an induction coil as will be more fully apparent hereinafter. In a prototype of this invention, except for the insulating blanket 26, the container 12 is not much different than that shown in U.S. Pat. No. 6,943,841 and pending application Ser. No. 11/172,042.

The heating circuit 14 comprises an induction heating unit 28, a power unit 30 receiving power from a conventional utility ac power source, a coolant circuit 32, an insulated hose or conduit 34 and an induction coil 36 around the container 12. The induction heating unit 28, power unit 30, coolant circuit 32 and insulated hose 34 were developed by Wonder Weld Induction Company of Orient, Ohio and are the subject of U.S. Printed Patent Application 20070215606 filed by inventor Timothy O. Albaugh, to which reference is made for a more complete description thereof. For present purposes, it will suffice to say that the power unit 30 connects to a conventional alternating current source of a local electrical utility and power is delivered to the induction heating unit 14. In the heating unit 28, alternating current from the power unit 30 is modified to produce a current in a pair of heating stations 38, 40 separated by an insulator 42. A pair of conduits 44, 46 connect to the stations 38, 40 and terminate in suitable threaded couplings 48, 50 that connect to the induction coil 36. The coolant circuit 32 delivers a liquid, usually water, from a reservoir 52, through a pump 54 and conduit 56 to the inside of the conduits 44, 46 to prevent the induction coil 36 and the mechanisms inside the heating unit 28 from overheating. The liquid coolant exits from the heating unit 28 through conduit 58 and passes through a heat exchanger 60 adjacent a powered fan 62 into the reservoir 52.

The insulated hose 34 surrounds the conduits 44, 46 and includes a rubberized exterior and sufficient insulating interior materials to prevent the conduits 44, 46 from injuring someone near the hose 34. The hose 34 is also of sufficient diameter and is only partly elastic to prevent impact or fatigue damage to the conduits 44, 46 caused by bending the hose 34. If needed, separate liquid coolant paths may be incorporated in the hose 34 to prevent overheating of the conduits 44, 46. Suitable insulated hoses may be obtained from Charles Rubber and Gasket Company of Lake Charles, La., NAPA Automotive or Industrial Rubber & Gasket of Sulphur, La.

The induction coil 36 may be made of any suitable material and typically includes a section 64 having an outer diameter sufficient to be closely received by the insulating blanket 26. As shown in FIG. 1, the coil section 64 terminates short of the top of the container 12 so only the bottom of the container 12 is heated. In some embodiments, the container 12 is vertical so the aluminum bar or rod 24 in the container 12 is heated only near the bottom thereof. Thus, the bottom of the rod 24 is consumed in the spraying process and the bar 24 falls by gravity into the heating zone as it is being consumed. In some embodiments, the section 64 terminates adjacent the top of the insulating blanket 26. A coil section 66 of smaller O.D. surrounds the nozzle 20. One function of the insulating blanket 26 is to center the smaller O.D. section 66 around the nozzle 20 and preventing physical contact.

The air delivery system 16 includes a suitable source of compressed air such as a compressor 68 having an inlet open to the earth's atmosphere and an exhaust delivering into a surge tank 70. For purposes more fully apparent hereinafter, some embodiments include a separator 72 and/or an automatic drip 74 for removing liquid water from the air delivery system 16. An air dryer 76 receives high pressure air from the surge tank 70 and connects to an air heater 78 which is illustrated as one or more coils 80 in an open tube 82 heated by a conventional hydrocarbon heater 84 fueled from a tank 86 filled with a suitable fuel, such as propane, LPG or other suitable fuel. In some embodiments, the air may be heated by electric filament heaters or by induction heating as suggested hereinafter which is more economical and capable of higher temperatures. Air from the heater 78 is delivered through a conduit 88 to the container 12 through a conventional coupling 90. Heating the air before it is delivered into the container 12 has interesting advantages. If relatively cold air is used to atomize liquid aluminum in the container 12, there is a risk of the cold air prematurely solidifying the aluminum. By heating the air before it enters the container 12, one reduces or eliminates the risk of spraying solid aluminum or partly solidified aluminum toward the article 18. Thus, heating the air may produce more consistent results. It will be apparent to those skilled in the art that simply compressing air causes its temperature to rise but this is an incidental heating that is not considered significant in this regard, at least to the pressures utilized, because such heating leaves the air's temperature far below the melting point of aluminum. The exact amount of heating the air is subject to wide variation because the thermal capacity of the container 12 may be so large as to greatly minimize the risk of spraying aluminum shot toward the article 18. Thus, in some embodiments, the air is heated to at least 500° F. and conceivably much hotter, i.e. well above the melting point of aluminum of 1220° F., prior to entering the container 12. Although there is no theoretical upper limit of the air temperature, when it gets too much above the melting point of aluminum, there is a natural tendency to accelerate the reaction of liquid aluminum with oxygen in the air to produce aluminum oxide which is considered detrimental to the strength and integrity of the coating. Thus, it would be unusual for the temperature of the heated air to be above 2500° F. Those skilled in the art will appreciate that the foregoing discussion also applies to the use of other gases instead of air, although the issue of oxygen reactions should not apply to gases which include no oxygen.

Under some atmospheric conditions, the dryer 76 provides an important function. If the humidity of air in the vicinity of the spray delivered through the nozzle 20 is above a certain value and the temperature is cool enough, the resultant aluminum layer deposited on the alloyed iron article 18 may not be acceptable in the sense that the layer may be overly rough and may contain small clumps which are prone to detach from the underlying iron surface, meaning the aluminum is not well bonded to the underlying iron surface.

The exact boundary between acceptable operating temperature and humidity conditions and unacceptable conditions is not known. It will suffice to say that in southwestern Louisiana on cool damp days, without drying the air supplied through the system 16, spraying aluminum produces unsatisfactory results while spraying on what are considered normal warm humid days produces satisfactory results even though the air is not dried. Thus, temperature may be more important in this regard than humidity but, because spraying has been conducted outdoors in the earth's atmosphere, not much can be done about temperature. It is believed that spraying inside a building that is of comfortable temperature will produce acceptable coating results even without drying the air used to atomize aluminum in the container 12.

It is believed prudent to dry the air used to atomize the liquid aluminum to be sprayed from the container. Delivering compressed air into the surge tank 70 will generate liquid water in the tank 70 because water is less soluble in high pressure air than in low pressure air so there is a danger of liquid water overflowing the surge tank 70. Thus, in some embodiments, a liquid trap and separator 72 may be provided downstream from the tank 70 or an automatic drip 74 may be provided on the tank 70 to remove liquid water from entering the inlet to the dryer 76.

The dryer 76 may be of any suitable type. An acceptable dryer 76 has been constructed using a desiccant material such as any of calcium chloride, sodium chloride, potassium chloride or the like available from Fastenal Corporation of Lake Charles, La., International Surface Preparation, Inc. of Houston, Tex. or other suppliers. In dryers of this type, the dryer vessel is filled with the desiccant material. After prolonged use, the desiccant material has adsorbed its load of water and must be replaced or regenerated, as by drawing saturated desiccant off the bottom of the dryer 76 and adding new material to the top. In some embodiments, the desiccant material is simply removed from the dryer vessel and replaced. In other embodiments, using appropriate desiccants such as Linde Molecular Sieves from Linde Corporation, a second dryer vessel is provided and humid air is delivered through one as the other is being heated to vaporize the adsorbed water and drive it off in the form of steam.

Operation of the system 10 is now described. The system 10 may be located out doors in the earth's atmosphere under existing temperature, wind and humidity conditions, whatever they might be. It has been learned that spraying at relatively low temperatures, e.g. under 60° F., under high relative humidity conditions often present in southwest Louisiana, e.g. greater than 80%, sometimes produces unacceptable results. This is not currently explainable because the container 12 is heated well above atmospheric temperature, the air is heated well above atmospheric temperature and the air is dried, all of which indicate that atmospheric conditions should not be a factor.

In a prototype of the system 10, the power unit 30 was manufactured by Wonder Weld Induction Company of Orient, Ohio to which reference is made for a more complete description thereof. The power unit 30 includes a conventional panel 92 for controlling operation of the induction heater 28. At the outset of spraying, control mechanisms on the panel 92 are adjusted to deliver the desired voltage, amperage and frequency of alternating current to the induction coil 36. Typically, the amount of power delivered to the induction coil 36 depends on the amount of aluminum that is intended to be sprayed so the amount of power is widely variable. Typically, power consumption in the range of 10-15 kw is found adequate to spray a considerable amount of metal while the applied voltage is, in some embodiments, in the range of 200-500 volts. The frequency of the alternating current passing through the induction coils is subject to some variation. For reasons which are not apparent, insufficient heating occurs to melt enough aluminum to be sprayed at generous rates outside a frequency range of about 20-80 kHz even though the total energy delivered to the induction coil 36 seems sufficiently high. A preferred range of 22-32 kHz has been found to work better. For example, at an applied frequency of 22-32 kHz, a generous amount of aluminum can be melted and sprayed with an applied wattage of only 10-15 kw at an applied voltage of 200-500 volts.

One of the surprising aspects of heating the container 12 and aluminum stock 24 by induction heating is how little electrical energy it takes. The amount of power consumption in a spray operation depends on a number of variables including the amount of aluminum being melted and the size of the atomizer but is surprisingly low.

In most embodiments, the container 12 is made of steel. Melting aluminum in the steel container 12 occurs because of two processes, one of which is easily explainable and one of which is not. Sending current through the induction coil 36 causes the steel container 12 to heat up until the lower end is orange-white hot because of the magnetic nature of the container 12. In other words, heat is generated by magnetically causing the iron molecules in the container 12 to vibrate. Heat is then transferred to the aluminum bar 22 located within the container 12 by conduction and radiation. What is not so explainable, is the aluminum bar 24 seems to be directly heated by the energy delivered through the induction coils. This is believed to be true because experiments have been conducted where an aluminum bar is placed in an induction coil with no surrounding steel container and melted by delivering energy through the induction coil. This has a significant effect because it means the container 12 and/or the nozzle 20, in some embodiments, can be made of nonmagnetic materials such as titanium.

Referring to FIG. 2, there is illustrated another spray system 94 comprising a container 96 for receiving a quantity of solid aluminum, a heating circuit 98 for heating the container 96, and a high pressure gas delivery system 100. For purposes of illustration, the container 96 and heating circuit 98 are substantially identical to the system 10 of FIG. 1.

The gas delivery system 100 comprises an induction heating unit 106 which may be located at any suitable location, such as adjacent or part of the heating unit delivering energy to heat the container 98. The heating unit 106 comprises a power unit 108 analogous to the power unit 30 and a coolant circuit 110 preventing the components of the heating unit and induction coil from overheating and an insulated or insulation lined vessel 112, conveniently of a ceramic material such as fused silica, titanium nitride or other ceramics which are thermal shock tolerant. The heating unit 106 includes a pair of conduits 114, 116 insulated in much the same manner as the conduits 44, 46 in FIG. 1. The conduits 114, 116 lead from heating stations on a side of the unit 106 into the vessel 112 where the conduits 114, 116 are arranged in a manner efficient for heat exchange with air flowing through the vessel 112.

In some embodiments, the conduits 114, 116 can be wrapped in a series of induction coils 118 of decreasing size, one placed inside another to provide substantial surface area for contact with air flowing through the vessel 112. An air compressor 120 delivers high pressure air to a surge tank 122 which is connected to an air dryer 124 which, in turn, connects to an inlet of the vessel 112. Air flowing through the vessel 112 is heated by the induction coils 118 and passes through the conduit 126 and coupling 128 into the container 96 where liquid aluminum droplets accumulating on the aluminum bar 130 are discharged through the nozzle 132 as an aluminum mist onto the alloyed iron article 134.

FIG. 3 illustrates a very efficient heat exchange technique or embodiment of an air heating system 136 incorporating an electric induction coil 138 connected to a power source 140. A coil 142 is connected to a source of dry air 144 and provides an outlet 146 delivering hot air to a container or compartment containing solid aluminum therein. The air coil 142 is nested inside the induction coil 138 and an insulating blanket 148 prevents the induction coil 142 from shorting out against the air coil 142. The air coil 142 is preferably made of steel or other material which is efficiently heated by induction. The hot air delivered from the air coil 142 passes through insulating tubing to atomize aluminum in the same manner as hot air from the heaters of FIGS. 1-2. In a prototype of FIG. 3, air was heated to 3000° F. which is sufficient to overcome all thermal losses and still melt aluminum in one of the containers.

Referring to FIG. 4, there is illustrated another spray system 150 comprising a container 152 for receiving a quantity of solid aluminum 154, a flexible insulated high temperature steel braided hose 156 and an air delivery circuit 158 for heating air delivered to the container 152. The air delivery circuit 158 includes an induction heating unit 160 analogous to the heating units 28, 106, a power unit analogous to the unit 30 and having a coolant circuit 164. The air delivery circuit 158 also includes a compressor 166, a surge tank 168 and an air dryer 170 delivering compressed air into a vessel 172 having one or more induction coils 174 therein. Hot air exits the vessel 172 to a fixture 176 to which the flexible braided hose 156 attaches.

In the system 150, aluminum is heated and melted solely by hot air passing through the insulated hose 156. Although very pure aluminum may be used to coat alloyed iron articles, it may be preferred to use scrap aluminum because of the cost advantage. Scrap aluminum, of course, is not pure and is normally alloyed with other metals such as titanium, vanadium and the like. Scrap aluminum is available in bales or in remelted bars. Even though remelted bars are available, it is much preferred to remelt the aluminum. In doing so, a skin or collection of lighter materials collects on the surface of the liquid aluminum. These lighter materials are skimmed off until the surface of the liquid aluminum is shiny. The compositions of these lighter materials is not known but they appear to be some time slag or other similar impurity. In any event, after skimming, the remelted aluminum is poured into molds to produce bars, rods or wire which are suitable for use in the devices disclosed herein. The subsequent spraying of remelted and skimmed aluminum produces coatings which are consistently better adhered to its substrate when compared to coatings made from scrap aluminum that has not been remelted. These coatings are as good as resulting from 99.76% pure aluminum which is, of course, dramatically more expensive.

Example 1

A flat specimen was made of carbon steel 4140 was analyzed for coating chemistry and thickness of the coating at five points. The specimen was coated by manually moving the article under the nozzle of the container 12 as shown in FIG. 1. This sample was analyzed using an Amray scanning electron microscope equipped with a Kevex energy dispersive X-ray spectrometer. The coating was analyzed by Constellation Technology Laboratories as follows:

| Semi-quantitative Chemistry by Weight Percent | |
|---|---|
| O | 1.3% |
| Al | 93.4% |
| Si | .8% |
| Fe | 4.1% |
| Na | .3% |

Thickness of the coating was measured at five locations. The results were, in microns: 14.9, 17.1, 16.8, 15.1 and 17.5 and averaged 16.3 microns. The coating is surprisingly uniform given the fact that the substrate was manually moved back and forth under the spray nozzle.

Example 2

Another flat specimen made of carbon steel 4140 was received for SEM/EDS analysis for coating chemistry, and thickness of the coating at five points. The sample was coated by manually moving the article under the nozzle of the container 12 as shown in FIG. 1. The sample was analyzed using an Amray scanning electron microscope (SEM) equipped with a Kevex energy dispersive X-ray spectrometer (EDS). The results were:

| | |
|---|---|
| C | 18.7% |
| O | 2.1% |
| Al | 70.1% |
| Si | 5.2% |
| Fe | 1.7% |
| Cu | 2.3% |

The coating adhesion test coupon was prepared by adhering two round couplings to the coating and substrate using 3M SCOTCHWELD 2214. The specimen was then tested for adhesions using a Tinius Olsen LoCap tensile tester with the 30,000 pound load cell. The coating separated from the substrate on a 1.00 inch diameter specimen at 3473 pounds showing an ultimate tensile strength of 4422 psi.

Example 3

A flat steel specimen of carbon steel 4140 was coated by manually moving the article under the nozzle of a container as shown in FIG. 1. The sample was adhesion tested per ASTM B-633. The sample was prepared by adhering 1" diameter steel bars to the coating using 3M adhesive 2214. A blank specimen was prepared using the same technique to validate the strength of the adhesive. The testing was performed using a Tinius Olsen LoCap tensile tester using the 30,000-pound load cell. The tensile load applied to the specimen at failure was 6874 pounds and the tensile strength of the coating was 8757 psi. At failure of the adhesive on the uncoated specimen, 8597 pounds was applied showing a tensile strength of the adhesive to be 10952 psi.

Although this invention has been disclosed and described in its preferred embodiments with a certain degree of particularity, it is understood that the present disclosure of the preferred forms is only by way of example and that numerous changes in the details of operation and in the combination and arrangement of parts may be resorted to without departing from the spirit and scope of the invention as hereinafter claimed.

Without limiting the foregoing, it is to be noted that those skilled in the art will appreciate that the alloyed iron article may comprise any one of a wide variety of alloys and therefore comprise elements besides iron. In addition, the apparatus and methods described can be used in a variety of conditions, such as temperature, relative humidity, and the like. Those skilled in the art will also appreciate that different temperature and humidity conditions, different pressures, different gases and different iron and aluminum components may be used as desired, depending on various preferences such as cost, appearance of the resultant product, and availability of materials, all without departing from the scope and spirit of the invention as claimed.

I claim:

1. A method of applying a thin aluminum layer to an alloyed iron article, comprising
    heating air with an electric induction coil and delivering the heated air through tubing to a compartment having solid aluminum therein;
    melting the solid aluminum in the compartment; and
    projecting the heated air and an aluminum mist through an outlet from the compartment onto an alloyed iron article;
    wherein the air travels through the coiled tube inside the electric induction coil and electrically separated therefrom by an insulating sheath, and the tubing is insulated tubing different from the insulating sheath.

2. The method of claim 1 wherein the air is heated to at least 500° F.

3. The method of claim 1 wherein the step of heating the air comprises heating the air in a ceramic container.

4. The method of claim 1 wherein the only heat source for melting the aluminum is the heated air.

5. The method of claim 1 further comprising the step of heating the compartment independently of the heated air.

6. The method of claim 5 wherein the independent heating step comprises heating the compartment with an electric induction coil.

7. The method of claim 1 wherein an alternating current in the frequency range of 20-80 kHz is supplied to the electric induction coil.

8. The method of claim 7 wherein the alternating current comprises a frequency within the range of 22-32 kHz.

9. The method of claim 8 wherein the applied voltage to the electric induction coil is in the range of 200-500 volts.

10. The method of claim 1 wherein the solid aluminum is formed by providing a batch of scrap aluminum, melting the scrap aluminum, skimming any lighter materials off the melted aluminum and then pouring the melted aluminum into a mold to produce the solid aluminum.

11. The method of claim 10 wherein the lighter materials are skimmed off the melted aluminum until an upper surface of the melted aluminum is shiny.

* * * * *